United States Patent [19]
Mitter

[11] Patent Number: 5,684,663
[45] Date of Patent: Nov. 4, 1997

[54] PROTECTION ELEMENT AND METHOD FOR PROTECTING A CIRCUIT

[75] Inventor: Chang Su Mitter, Tempe, Ariz.

[73] Assignee: Motorola, Inc., Schaumburg, Ill.

[21] Appl. No.: 536,876

[22] Filed: Sep. 29, 1995

[51] Int. Cl.$^6$ .................................................... H02H 5/04
[52] U.S. Cl. ........................... 361/106; 361/103; 361/100
[58] Field of Search ............................... 361/93, 98, 100, 361/101, 106, 103, 18; 323/276, 277

[56] References Cited

U.S. PATENT DOCUMENTS

| | | | |
|---|---|---|---|
| 4,202,023 | 5/1980 | Sears | 361/18 |
| 4,638,396 | 1/1987 | Mukli et al. | 361/101 |
| 4,695,935 | 9/1987 | Oen et al. | 363/21 |
| 4,800,331 | 1/1989 | Vesce et al. | 323/277 |
| 4,851,954 | 7/1989 | Sürig et al. | 361/106 |
| 4,891,728 | 1/1990 | Preis et al. | 361/18 |
| 4,945,358 | 7/1990 | Wrzesinski | 361/42 |
| 5,257,155 | 10/1993 | Robb et al. | 361/18 |
| 5,272,392 | 12/1993 | Wong et al. | 327/109 |
| 5,285,346 | 2/1994 | Davies | 361/100 |
| 5,301,082 | 4/1994 | Stolarczyk et al. | 361/58 |

FOREIGN PATENT DOCUMENTS

| | | | |
|---|---|---|---|
| 9411936 | 5/1994 | WIPO | H02H 9/02 |

OTHER PUBLICATIONS

Texas Instruments, "TPS2010, TPS2011, TPS2012, TPS2013 Power Distribution Switches", Dec. 1994, pp. 1–17.

Raychem, PolySwitch® Resettable Fuses for Circuit Protection Information Package, Fang et al., "Conductive Polymers Prolong Circuit Life", Jan. 1995 (Reprinted from Design News, Nov. 9, 1992).

Raychem, PolySwitch® Resettable Fuses for Circuit Protection Information Package, Harry White, "Reliability of Polymeric Composite Circuit Protectors", Jan. 1995 (Reprinted from May 1994 issue of Quality—©Chilton Publications).

*Primary Examiner*—Jeffrey A. Gaffin
*Assistant Examiner*—Sally C. Medley
*Attorney, Agent, or Firm*—Ziye Joe Zhou; Rennie William Dover

[57] ABSTRACT

A protection element (10) protects a battery pack (36) from potential faulty conditions in a load (38). The protection element (10) includes a switch (12), a control FET (14), and three resistors (16, 18, and 22). Under normal operating conditions, the switch (12) is conductive and the control FET (14) is non-conductive. If a short circuit is detected, the controller (14) becomes conductive and turns off the switch (12). The switch (12) remains non-conductive until the load (38) is disconnected from the protection element (10). The protection element (10) further includes a temperature sensor (24) that turns off the switch (12) at high temperatures and a current limiting element (28) that imposes an upper limit on the current flowing through the protection element (10). Control signals can be applied to the gate electrodes of the switch (12) and the control FET (14) to modulate the current in the protection element (10).

30 Claims, 6 Drawing Sheets

PROTECTION ELEMENT AND METHOD FOR PROTECTING A CIRCUIT

BACKGROUND OF THE INVENTION

The present invention relates, in general, to protecting a circuit, and more particularly, to protecting a circuit from faulty conditions such as short circuit, over-current, and over-heating conditions.

In portable electronic applications, an electronic device, e.g., a battery pack is often subjected to physical and electrical stresses. Three common and potentially destructive stresses are short circuits, over-currents, and over-heating. A fuse offers protection from theses stresses, but the fuse needs to be replaced after each activation. A temperature dependent resistor having a positive temperature coefficient also offers protection from these stresses by increasing the resistance of the resistor to reduce the current flow as the temperature increases. The temperature increase may be caused by short circuits, over-currents, or other faulty conditions. However, as the resistance of the temperature dependent resistor increases, the drainage of the battery power continues because the circuit is not completely switched off. More complicated temperature sensing circuits either reduce the current flow or switch the circuit off when the temperature exceeds a predetermined value. These types of circuits usually reset itself once the temperature is below a predetermined value regardless of whether the cause of the faulty condition is removed or not. Some short circuit protection devices, such as silicon control rectifiers (SCRs), switch the circuit off when a faulty condition is detected and reset the circuit after power is removed from the circuit; others reduce the current flow to protect the circuit from the faulty condition without switching the circuit off and, therefore, the circuit continues to drain the battery.

Accordingly, it would be advantageous to have a protection element that switches the circuit off when a short circuit is detected and resets the circuit when the fault is removed without disconnecting the power source from the circuit. It would be of further advantage for the protection element to have the capabilities of limiting the current flow in the circuit and, when the temperature is too high, switching the circuit off. It is also desirable for the protection element to be simple, reliable, easy to manufacture, inexpensive, light in weight, and small in size.

DETAILED DESCRIPTION OF THE DRAWINGS

Generally, the present invention provides a protection element and a method for protecting a circuit from stresses. More particularly, the present invention provides an active semiconductor element that switches off under a short circuit condition and resets itself after the removal of the faulty condition.

Figure 1:
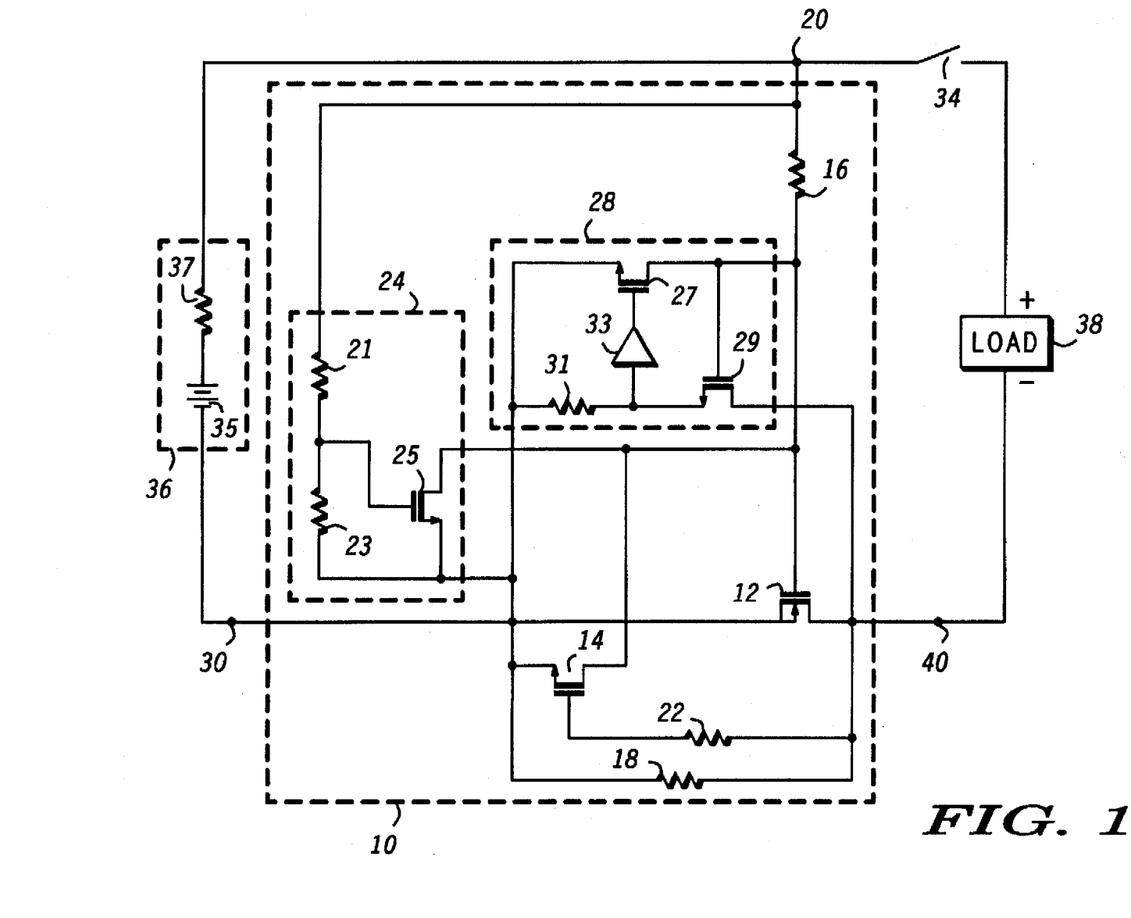
FIG. 1 illustrates a schematic diagram of a protection element in accordance with a first embodiment of the present invention.

FIG. 1 illustrates a schematic diagram of a protection element 10 in accordance with a first embodiment of the present invention. Protection element 10 protects a battery pack 36 from potential faulty conditions in a load 38 which drains power from battery pack 36. Protection element 10 has a common terminal 20 connected to a positive terminal of battery pack 36. Terminal 20 is also coupled to a positive terminal of load 38 via a power switch 34. A first terminal 30 of protection element 10 is connected to a negative terminal of battery pack 36 and a second terminal 40 of protection element 10 is connected to a negative terminal of load 38. Under faulty conditions, protection element 10 becomes non-conductive between terminal 40 and terminal 30, resulting in battery pack 36 being isolated from load 38. Suitable structures for load 38 include passive devices such as, for example, resistors, capacitors, and inductors, as well as active devices such as, for example, transistors. Battery pack 36, which is equivalent to a voltage source 35 and an internal resistor 37 in a series combination, may include a single battery, a direct current (DC) power source, or combinations thereof.

Protection element 10 includes a first n-channel insulated gate field effect transistor (FET) 12 serving as a switch between terminal 30 and terminal 40 and a second n-channel insulated gate FET 14 which controls FET 12. FET 12 has a gate electrode coupled to terminal 20 via a resistor 16, a source electrode connected to terminal 30, and a drain electrode connected to terminal 40. FET 14 has a gate electrode coupled to the drain electrode of FET 12 via a resistor 22, a source electrode connected to the source electrode of FET 12, and a drain electrode connected to the gate electrode of FET 12. A resistor 18 couples the drain electrode of FET 12 to the source electrode of FET 14. When FET 12 is non-conductive, thereby isolating battery pack 36 from load 38, a leakage current flowing through resistor 18 continues to drain the battery power. Such a leakage current is undesirable. Therefore, it is preferred to select a large resistance value, e.g., in the range of mega-ohms, for resistor 18.

Protection element 10 also includes a temperature sensor 24 that comprises two temperature dependent resistors 21 and 23, and a FET 25. FET 25 has a source electrode connected to the source electrode of FET 12 and a drain electrode connected to the gate electrode of FET 12. A gate electrode of FET 25 is coupled to terminal 20 via resistor 21 and coupled to the source electrode of FET 25 via resistor 23. Resistor 21 has a negative temperature coefficient and resistor 23 has a positive temperature coefficient. A leakage current flowing through resistors 21 and 23 drains the power from battery pack 36. To minimize such a leakage current, it is desirable the total resistance of resistors 21 and 23 to be large, e.g., in the range of mega-ohms. It should be noted that the structure of temperature sensor 24 is not limited to that illustrated in FIG. 1. Any temperature sensor capable of switching FET 12 off when the temperature exceeds a predetermined value may be used in place of temperature sensor 24. By way of example, temperature sensor 24 is removed and a control resistor having a negative temperature coefficient is inserted between the gate and source electrodes of FET 12 to implement the function of temperature sensor 24. In this example, resistor 16 is selected to have a positive temperature coefficient to improve the temperature sensing capability of protection element 10.

Protection element 10 further includes a current limiting element 28 comprised of two FETs 27 and 29, a resistor 31, and an amplifier 33. FET 27 has a source electrode connected to the source electrode of FET 12 and a drain electrode connected to the gate electrode of FET 12. FET 29 has a gate electrode connected to the drain electrode of FET 27, a source electrode coupled to the source electrode of FET 27 via sense resistor 31, and a drain electrode connected to the drain electrode of FET 12. Amplifier 33 has an input terminal connected to the source electrode of FET 29 and an output terminal connected to the gate electrode of FET 27. It should be noted that the structure of current limiting element 28 is not limited to that illustrated in FIG. 1. An element that is capable of adjusting the gate-source voltage of FET 12 in accordance with the source-drain current of FET 12 may replace current limiting element 28.

FIG. 1 illustrates protection element 10 as including five n-channel insulated gate field transistors and, under faulty conditions, isolating battery pack 36 from load 38 by disconnecting their negative terminals. It should be understood that this is not intended as a limitation of the present invention. FETs 12, 14, 25, 27, and 29 in protection element 10 may be replaced by bipolar transistors, insulated gate bipolar transistors, metal semiconductor field effect transistors, or the like. When interchanging bipolar transistors with field effect transistors, those skilled in the art are aware that for a field effect transistor, a gate electrode serves as a control electrode of the transistor, and source and drain electrodes serve as current conducting electrodes; for a bipolar transistor, a base electrode serves as a control electrode of the transistor, and emitter and collector electrodes serve as current conducting electrodes. If protection element 10 is used to disconnect the negative terminal of battery pack 36 from the negative terminal of load 38 under faulty conditions, such as in the embodiment illustrated in FIG. 1, the five transistors in protection element 10 are designed to be either n-channel field effect transistors or NPN bipolar transistors. On the other hand, if protection element 10 is used to disconnect the positive terminal of battery pack 36 from the positive terminal of load 38 under faulty conditions, the five transistors in protection element 10 are designed to be either p-channel field effect transistors or PNP bipolar transistors.

Under normal operating conditions, a charge path from the positive terminal of battery pack 36 through resistor 16 to the gate electrode of FET 12 places FET 12 in a conductive state by raising the gate-source voltage of FET 12 to the output voltage of battery pack 36. The voltage across the drain and source electrodes of FET 12 is lower than the threshold voltage of FET 14 and, therefore, FET 14 is non-conductive. FET 12, being conductive, completes the current path between battery pack 36 and load 38. Resistors 16 and 22 protect FETs 12 and 14, respectively, from voltage spikes caused by, for example, electrostatic discharge.

In a condition referred as a hard-short, the two terminals of load 38 are brought in contact with a very low impedance material. In the hard-short condition, the voltage across node 20 and node 40 decrease to zero. The gate-drain voltage of FET 12 also decreases to zero. Therefore, the gate-source voltage of FET 12 is equal to drain-source voltage of FET 12. If the drain-source voltage of FET 12 is less than its threshold voltage, FET 12 is switched off, thereby isolating battery pack 36 from load 38. If a voltage greater than the threshold voltage of FET 12 develops across the drain and source electrodes of FET 12, the same voltage also develops across the gate and source electrodes of FET 14. FET 14 becomes conductive when the voltage across its gate and source electrodes exceeds its threshold voltage. FET 14, being conductive, pulls down the voltage across the gate and source electrodes of FET 12. When the gate-source voltage of FET 12 is less than its threshold voltage, FET 12 becomes non-conductive, thereby isolating battery pack 36 from load 38. When the short circuit condition is removed, the charge accumulated on the gate electrode of FET 14 dissipates through resistor 22 and resistor 18, and FET 14 becomes non-conductive. The charge path from the positive terminal of battery pack 36 through resistor 16 to the gate electrode of FET 12 raises the voltage across the gate and source electrodes of FET 12 to the level of the output voltage of battery pack 36, resulting in FET 12 becoming conductive and protection element 10 resetting itself.

In a condition referred as a soft-short, the impedance between the two terminals of load 38 is small but finite. In the soft-short condition, the low impedance of load 38 causes a large current to flow in battery pack 36 and load 38. The large current develops a voltage across internal resistor 37 in battery pack 36, such that the output voltage of battery pack 36 decreases, resulting in a decrease in the voltage across load 38 and a decrease in the voltage across the gate and source electrodes of FET 12. In one case, FET 12 becomes non-conductive when its gate-source voltage decreases below its threshold voltage, thereby isolating battery pack 36 from load 38. In another case, the decreased gate-source voltage of FET 12 and the large current flowing through FET 12 develop a voltage across the drain and source electrodes of FET 12. A soft-short trigger current is defined as a value of the current in protection element 10 when the voltage across the drain and source electrodes of FET 12 is equal to the threshold voltage of FET 14. When the current in protection element 10 reaches the soft-short trigger current, FET 14 becomes conductive and switches FET 12 off, thereby isolating battery pack 36 from load 38. When load 38, which is in the soft-short condition, is removed, protection element 10 resets itself to the normal operating state with FET 14 being non-conductive and FET 12 being conductive.

By adjusting the threshold voltages of FET 12 and FET 14, the short circuit response time and the soft-short trigger current of protection element 10 can be adjusted. A high threshold voltage for FET 12 and a low threshold voltage for FET 14 result in protection element 10 having a fast short circuit response time and a low soft-short trigger current. Resistor 22 and the gate capacitance of FET 14 provide a time delay in raising the gate-source voltage of FET 14, thereby avoiding inadvertent switching-off of protection element 10 that may be caused by a large capacitance in load 38.

Temperature sensor 24 senses the temperature of protection element 10 and switches FET 12 off if the temperature exceeds a predetermined temperature value. As the temperature rises, the resistance of resistor 21 decreases and the resistance of resistor 23 increases because of their negative and positive temperature coefficients, respectively. Because resistors 21 and 23 work as a voltage divider, the voltage across the gate and source electrodes of FET 25, which is equal to the voltage across resistor 23, rises with the increasing temperature. A trigger temperature is defined as a temperature at which the gate-source voltage of FET 25 exceeds its threshold voltage, resulting in FET 25 becoming conductive and switching FET 12 off. The voltage across the drain and source electrodes of non-conductive FET 12 switches FET 14 on. If the increase in temperature is caused by a large current, conductive FET 14 keeps FET 12 non-conductive even after the temperature drops and FET 25 is switched off. Protection element 10 continues to isolate battery pack 36 from load 38 until the faulty condition is removed. The resistance ratio of resistor 21 to resistor 23, the temperature coefficients of resistors 21 and 23, and the threshold voltage of FET 25 determine the trigger temperature of protection element 10.

Current limiting element 28 imposes an upper limit on a load current flowing through load 38 by adjusting the gate-source voltage of FET 12. The load current is divided between the drain-source currents of FET 12 and FET 29 according to the drain-source resistance of FET 12, the drain-source resistance of FET 29, and the resistance of resistor 31. The current flowing through the drain and source electrodes of FET 29 develops a sense voltage across resistor 31. Amplifier 33 amplifies the voltage across resistor 31 and transmits the amplified voltage to the gate electrode of FET 27. When the sense voltage across resistor 31 approaches or exceeds a predetermined voltage value, the amplified voltage approaches or exceeds the threshold voltage of FET 27. FET 27 generates a current through resistor 16, thereby developing a voltage across resistor 16. The voltage across resistor 16 lowers the gate-source voltage of FETs 12 and 29, thereby imposing a limit on the load current flowing through the drain and source electrodes of FETs 12 and 29. To increase the efficiency of protection element 10, it is desirable for the current flowing through resistor 31 to be as small as possible. A small current develops a small voltage across resistor 31. Amplifier 33 amplifies the small voltage across resistor 31 and transmits a large voltage signal to the gate electrode of FET 27, so that the gate-source voltage of FET 27 approaches or exceeds its threshold voltage when the load current reaches a predetermined upper limit.

Figure 2:
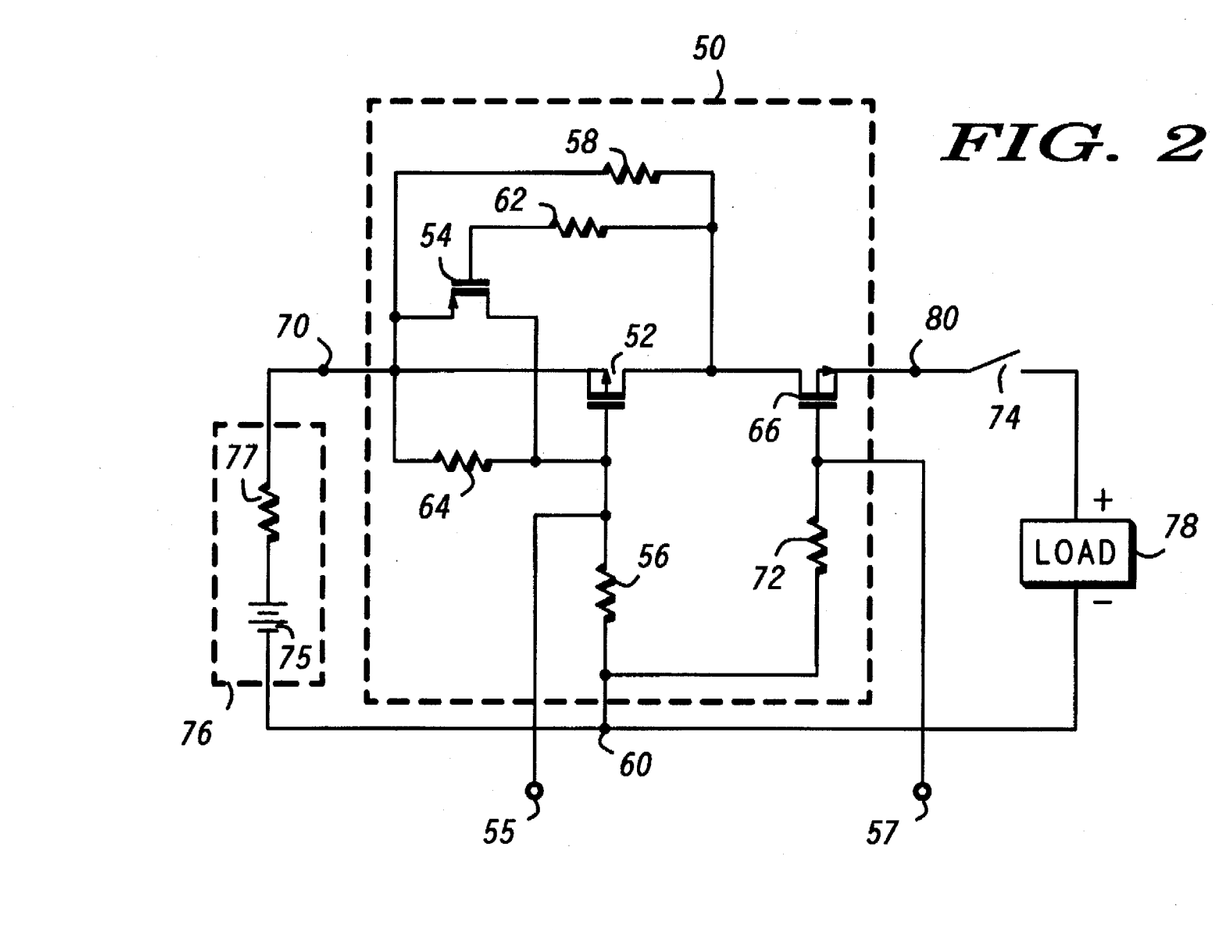
FIG. 2 illustrates a schematic diagram of a protection element in accordance with a second embodiment of the present invention.

FIG. 2 illustrates a schematic diagram of a protection element 50 in accordance with a second embodiment of the present invention. Protection element 50 protects a battery pack 76 from potential faulty conditions in a load 78 during both charging and discharging cycles. Protection element 50 has a common terminal 60 connected to a negative terminal of battery pack 76 and to a negative terminal of load 78. A first terminal 70 of protection element 50 is connected to a positive terminal of battery pack 76 and a second terminal 80 of protection element 50 is connected to a positive terminal of load 78 via a power switch 74. Under faulty conditions, protection element 50 becomes non-conductive between terminal 70 and terminal 80, thereby isolating battery pack 76 from load 78. Suitable structures for load 78 include passive devices such as, for example, resistors, capacitors, and inductors, as well as active devices such as, for example, transistors. Battery pack 76, which is equivalent to a voltage source 75 and an internal resistor 77 in a series combination, may include a single battery, a DC power source, or combinations thereof.

Protection element 50 includes a first p-channel insulated gate field FET 52 serving as a switch between terminal 70 and terminal 80 during a discharging cycle, a second p-channel insulated gate FET 54 serving as a controller of FET 52, and a third p-channel insulated gate FET 66 serving as a switch between terminal 80 and terminal 70 during a charging cycle. FET 52 has a gate electrode coupled to terminal 60 via a resistor 56 and a source electrode connected to terminal 70. FET 54 has a gate electrode coupled to a drain electrode of FET 52 via a resistor 62, a source electrode connected to the source electrode of FET 52, and a drain electrode connected to the gate electrode of FET 52. A resistor 58 couples the drain electrode of FET 52 to the source electrode of FET 54. FET 66 has a gate electrode coupled to terminal 60 via a resistor 72, a source electrode connected to terminal 80, and a drain electrode connected to the drain electrode of FET 52. The gate electrodes of FET 52 and FET 66 are coupled to a node 55 and a node 57, respectively, for receiving control signals. A resistor 64 couples the gate electrode of FET 52 to the source electrode of FET 52. Because a leakage current flowing through resistor 58 drains the battery power of battery pack 76 when protection element 50 is switched off, the resistance of resistor 58 is selected to be large, e.g., in the range of mega-ohms. Likewise, selecting a large total resistance for resistors 56 and 64 reduces the leakage current flowing through them. To provide a temperature sensing capability so that protection element 50 will switch off at high temperature, resistor 56 is designed to have a positive temperature coefficient and resistor 64 is designed to have a negative temperature coefficient.

FIG. 2 illustrates protection element 50 as including three p-channel insulated gate field transistors and, under faulty conditions, isolating battery pack 76 from load 78 by disconnecting their positive terminals. It should be understood that this is not intended as a limitation of the present invention. FETs 52, 54, and 66 in protection element 50 may be replaced by bipolar transistors, insulated gate bipolar transistors, metal semiconductor field effect transistors, or the like. If protection element 50 is used to disconnect the positive terminal of battery pack 76 from the positive terminal of load 78 under faulty conditions, such as in the embodiment illustrated in FIG. 2, the three transistors in protection element 50 are designed to be either p-channel field effect transistors or PNP bipolar transistors. On the other hand, if protection element 50 is used to disconnect the negative terminal of battery pack 76 from the negative terminal of load 78 under faulty conditions, the three transistors in protection element 50 are designed to be either n-channel field effect transistors or NPN bipolar transistors. Furthermore, resistor 64 in protection element 50 can be replaced by a temperature sensor of the same structure as temperature sensor 24 shown in FIG. 1. Protection element 50 can also have current limiting capabilities by including a current limiting element of the same structure as current limiting element 28 shown in FIG. 1.

Under normal operating conditions during a discharging cycle, a charge path from the negative terminal of battery pack 76 through resistor 56 to the gate electrode of FET 52 places FET 52 in a conductive state and a charge path from the negative terminal of battery pack 76 through resistor 72 to the gate electrode of FET 66 places FET 66 in a conductive state. The voltage across the source and drain electrodes of FET 52 is lower than an absolute value of the threshold voltage of p-channel FET 54 and, therefore, FET 54 is in a non-conductive state. FETs 52 and 66, both being conductive, complete the current path between battery pack 76 and load 78. It should be noted that, because of the orientation of the body diode of FET 66, a current can flow though FET 66 from its drain electrode to its source electrode even if FET 66 is switched off. Therefore, the state of FET 66 is inconsequential for protection element 50 during the discharging cycle. A system processor, not shown in FIG. 2, can modulate the load current by adjusting a control signal applied to node 55. Resistors 56, 62, and 72 protect FETs 52, 54, and 66, respectively, from voltage spikes caused by, for example, electrostatic discharge.

In a hard-short condition during the discharging cycle, the voltage across node 80 and node 60 decrease to zero. The potential at the drain electrode of FET 52 decreases, approaching the potential at the gate electrode of FET 52. The potential at the source electrode of FET 52 also decreases. If the voltage across the source and gate electrodes of FET 52 is less than an absolute value of the threshold voltage of p-channel FET 52, FET 52 becomes non-conductive, thereby isolating battery pack 76 from load 78. If a voltage larger than the absolute value of the threshold voltage of p-channel FET 52 develops across the source and drain electrodes of FET 52, the same voltage also develops across the source and gate electrodes of FET 54. FET 54 becomes conductive when the voltage across its source and gate electrodes is larger than the absolute value of its threshold voltage. FET 54, being conductive, pulls down the voltage across the source and gate electrodes of FET 52. FET 52 becomes non-conductive, thereby isolating battery pack 76 from load 78. Because the source and gate electrodes of FET 66 are at the same potential in the hard-short, FET 66 is also switched off. When the short circuit condition is removed, the charge accumulated on the gate electrode of FET 54 dissipates through resistor 62 and resistor 58 and, FET 54 becomes non-conductive. A current flowing through resistors 64 and 56 develops a voltage across the source and gate electrodes of FET 52, resulting in FET 52 becoming conductive and protection element 50 resetting itself.

In a soft-short condition, a small impedance between the two terminals of load 78 causes a large current to flow in battery pack 76 and load 78. The large current develops a voltage across internal resistor 77 in battery pack 76, so that the output voltage of battery pack 76 decreases, resulting in a decrease in the source-gate voltage of FET 52. In one case, FET 52 becomes non-conductive when its gate-source voltage is less negative than its threshold voltage, thereby isolating battery pack 76 from load 78. In another case, the decreased source-gate voltage of FET 52 and the large current flowing through FET 52 develop a voltage across the source and drain electrodes of FET 52 and across the source and gate electrodes of FET 54. When the voltage across the source and gate electrodes of FET 54 reaches the absolute value of the threshold voltage of p-channel FET 54, a soft-short trigger current of protection element 50 is reached and FET 54 becomes conductive. FET 54, being conductive, switches FET 52 off, thereby isolating battery pack 76 from load 78. In the soft-short condition, FET 66 may be on or off depending on its threshold voltage. When load 78 with the soft-short condition is removed, protection element 50 resets itself to the normal operating state with FET 54 being non-conductive and FET 52 being conductive.

By adjusting the threshold voltages of FET 52 and FET 54, the short circuit response time and the soft-short trigger current of protection element 50 can be adjusted. A more negative threshold voltage for FET 52 and a less negative threshold voltage for FET 54 result in protection element 50 having a fast short circuit response time and a low soft-short switching-off trigger current. The resistance ratio of resistor 56 to resistor 64 also determines the soft-short trigger current of protection element 50. A high resistance ratio results in a low soft switching-off trigger current for protection element 50. Resistor 62 and the gate capacitance of FET 54 provide a time delay in lowering the gate-source voltage of FET 54, thereby avoiding inadvertent switching-off of protection element 50 that may be caused by a large capacitance in load 78.

Resistors 56 and 64 sense the temperature of protection element 50 and switch FET 52 off if the temperature exceeds a predetermined value. As the temperature rises, the resistance of resistor 64 decreases and the resistance of resistor 56 increases because of their negative and positive temperature coefficients, respectively. Because resistors 56 and 64 work as a voltage divider, the voltage across the source and gate electrodes of FET 52, which is equal to the voltage across resistor 64, decreases with the increasing temperature. When the gate-source voltage of FET 52 is less negative than its threshold voltage, a trigger temperature of protection element 50 is reached and FET 52 becomes non-conductive. The voltage across the source and drain electrodes of non-conductive FET 52 switches FET 54 on. If the increase in temperature is caused by a large current, conductive FET 54 keeps FET 52 non-conductive even after the temperature decreases below the predetermined value. Protection element 50 continues to isolate battery pack 76 from load 78 having the faulty condition until it is removed. It should be noted that the resistance ratio of resistor 56 to resistor 64, the temperature coefficients of resistors 56 and 64, and the threshold voltage of FET 52 determine the trigger temperature of protection element 50.

During a charging cycle, load 78 is replaced by a battery charger serving as a power source and battery pack 76 becomes a load. The charging current flows into battery pack 76 through its positive terminal. Because of the orientation of the body diode of FET 52, a current can flow through FET 52 from its drain electrode to its source electrode even if FET 52 is switched off and, therefore, the state of FET 52 is inconsequential for protection element 50 in the charging cycle. While charging battery pack 76, a system processor, not shown in FIG. 2, constantly monitors the voltage level of battery pack 76. If an abnormal condition is detected, the system processor sends a signal to node 57 to switch FET 66 off. Battery pack 76 is isolated from the battery charger to prevent further charging. Furthermore, the system processor can modulate the current flowing through the battery by adjusting the control signal applied to node 57.

Figure 3:
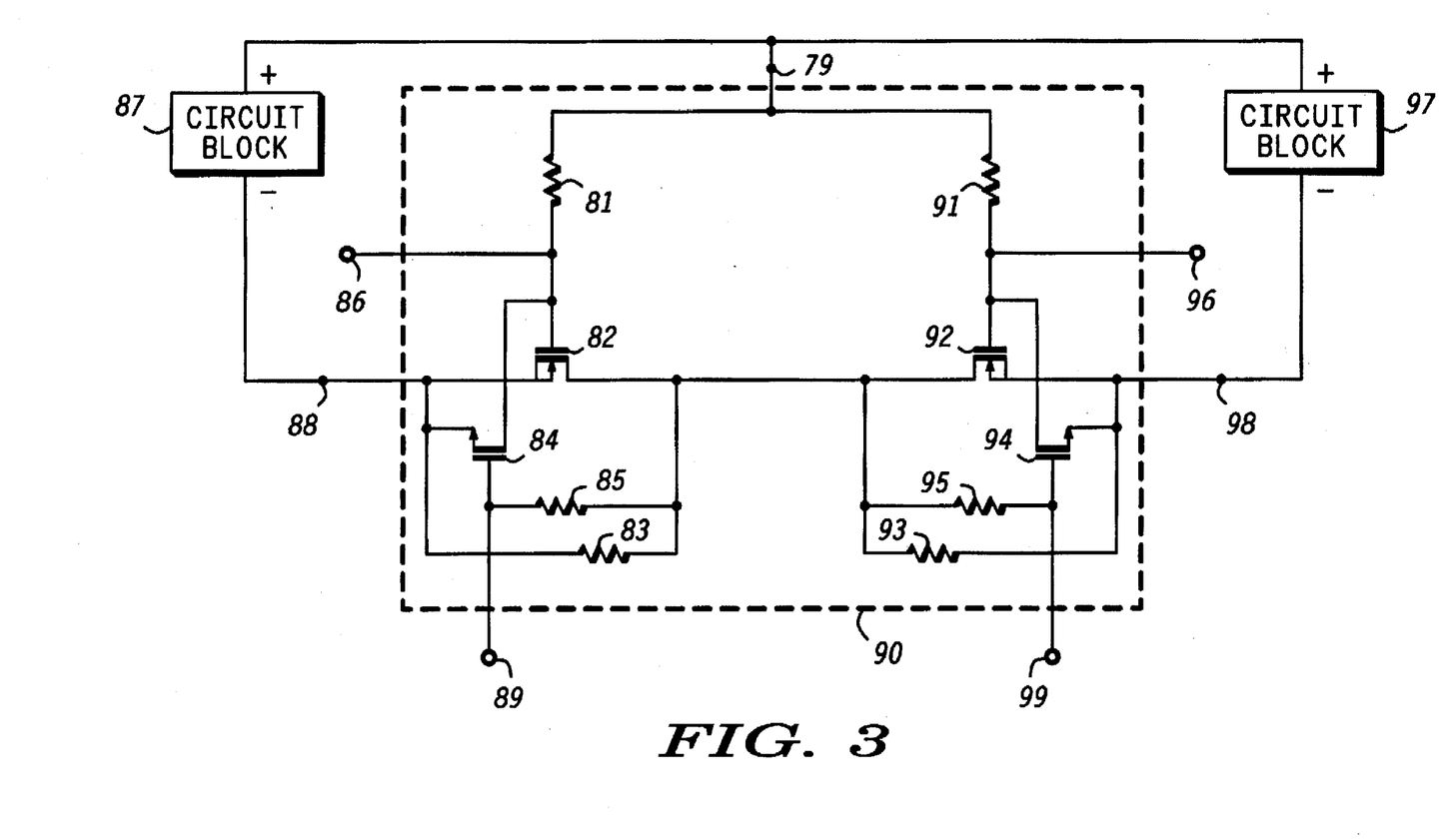
FIG. 3 illustrate a schematic diagram of a bi-directional protection element in accordance with a third embodiment of the present invention.

FIG. 3 illustrates a schematic diagram of a bi-directional protection element 90 in accordance with a third embodiment of the present invention suitable for manufacture using semiconductor process techniques. Protection element 90 protects a circuit block 87 from potential faulty conditions in a circuit block 97 and protects circuit block 97 from potential faulty conditions in circuit block 87. Protection element 90 has a common terminal 79 connected to positive terminals of circuit blocks 87 and 97. A first terminal 88 of protection element 90 is connected to a negative terminal of circuit block 87 and a second terminal 98 of protection element 90 is connected to a negative terminal of circuit block 97. Under faulty conditions, protection element 90 becomes non-conductive between terminal 88 and terminal 98, thereby isolating circuit blocks 87 and 97 from each other. Suitable structures for circuit blocks 87 and 97 include passive devices such as, for example, resistors, capacitors, and inductors, as well as active devices such as, for example, transistors.

Protection element 90 includes two n-channel insulated gate FETs 82 and 92 serving as switches between terminal 88 and terminal 98 and two n-channel insulated gate FETs 84 and 94 which control FETs 82 and 92, respectively. FET 82 has a gate electrode coupled to terminal 79 via a resistor 81, a source electrode connected to terminal 88, and a drain electrode connected a drain electrode of FET 92. A gate electrode of FET 92 is coupled to terminal 79 via a resistor 91. A source electrode of FET 92 is connected to terminal 98. FET 84 has a gate electrode coupled to the drain electrode of FET 82 via a resistor 85, a source electrode connected to the source electrode of FET 82, and a drain electrode connected to the gate electrode of FET 82. FET 94 has a gate electrode coupled to the drain electrode of FET 92 via a resistor 95, a source electrode connected to the source electrode of FET 92, and a drain electrode connected to the gate electrode of FET 92. A resistor 83 couples the drain electrode of FET 82 to the source electrode of FET 84. A resistor 93 couples the drain electrode of FET 92 to the source electrode of FET 94. The gate electrodes of FETs 82, 92, 84, and 94 are connected to nodes 86, 96, 89, and 99, respectively, for receiving control signals. To minimize a leakage current flowing through resistors 83 and 93 when FETs 82 and 92 are switched off, resistors 83 and 93 are preferably selected to have large resistance values, e.g., in the range of mega-ohms.

FIG. 3 illustrates protection element 90 as including four n-channel insulated gate field effect transistors and, under faulty conditions, isolating circuit blocks 87 and 97 from each other by disconnecting their negative terminals. It should be understood that this is not intended as a limitation of the present invention. FETs 82, 84, 92, and 94 in protection element 90 may be replaced by bipolar transistors, insulated gate bipolar transistors, metal semiconductor field effect transistors, or the like. If protection element 90 is used to disconnect the negative terminal of circuit block 87 from the negative terminal of circuit block 97 under faulty conditions, such as in the embodiment illustrated in FIG. 3, the four transistors in protection element 90 are designed to be either n-channel field effect transistors or NPN bipolar transistors. On the other hand, if protection element 90 is used to disconnect the positive terminal of circuit block 87 from the positive terminal of circuit block 97 under faulty conditions, the four transistors in protection element 90 are designed to be either p-channel field effect transistors or PNP bipolar transistors.

Protection element 90 can include a temperature sensor of the same structure as temperature sensor 24 shown in FIG. 1 or a resistor like resistor 64 in FIG. 2 for coupling the gate electrode of FET 82 to the source electrode of FET 82. Likewise, the gate and source electrodes of FET 92 can be coupled together via a temperature sensor of the same structure as temperature sensor 24 in FIG. 1 or a resistor like resistor 64 in FIG. 2.

Protection element 90 can include a current limiting element of the same structure as current limiting element 28 shown in FIG. 1. If the current limiting element is coupled to FET 82 in a configuration similar to that of current limiting element 28 coupled to FET 12 in FIG. 1, protection element 90 will have the capability of limiting current flowing from terminal 99 to terminal 89. If the current limiting element is coupled to FET 92 in a configuration similar to that of current limiting element 28 coupled to FET 12 in FIG. 1, protection element 90 will have the capability of limiting current flowing from terminal 89 to terminal 99. For protection element 90 to have the capability of limiting current flowing in both directions, two current limiting elements are required, one coupled to FET 82, and the other coupled to FET 92.

Under normal operating conditions, a charge path from terminal 79 through resistors 81 to the gate electrode of FET 82 and a charge path from terminal 79 through resistor 91 to the gate electrode of FET 92 place FET 82 and 92 in conductive states, respectively. The voltages across the drain and source electrodes of FET 82 and across the drain and source electrodes of FET 92 are lower than the threshold voltages of FET 84 and FET 94, respectively. Therefore FET 84 and FET 94 are non-conductive. FETs 82 and 92, both being conductive, complete the current path between circuit blocks 87 and 97.

Under short circuit conditions, protection element 90 operates in the same way as protection element 10 in FIG. 1 and protection element 50 in FIG. 2 during the discharging cycle. Because protection element 90 is symmetric, it terminates current flowing in both directions under short circuit conditions. FET 82 is used to stop current flowing from terminal 98 to terminal 88, and FET 92 is used to stop current flowing from terminal 88 to terminal 98.

Nodes 86, 96, 89, and 99 offer user controllability of protection element 90. A control signal applied to node 86 is used to terminate or modulate the current flowing from terminal 98 to terminal 88. A control signal applied to node 89 is used to terminate the current flowing from terminal 98 to terminal 88. A control signal applied to node 96 is used to terminate or modulate the current flowing from terminal 88 to terminal 98. A control signal applied to node 99 is used to terminate the current flowing from terminal 98 to terminal 88.

Figure 4:
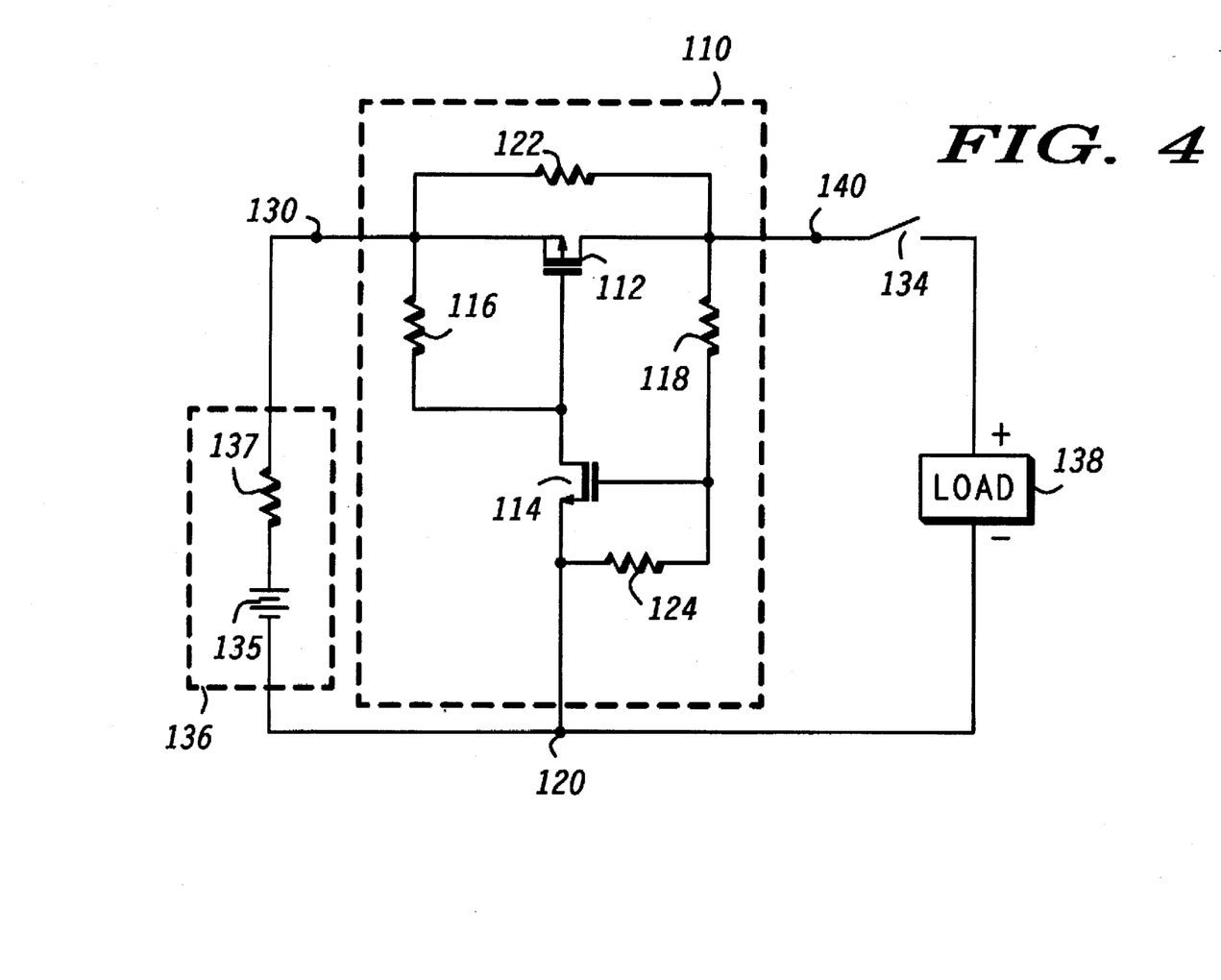
FIG. 4 illustrates a schematic diagram of a protection switch in accordance with a fourth embodiment of the present invention.

FIG. 4 illustrates a schematic diagram of a short circuit protection switch 110 in accordance with a fourth embodiment of the present invention. Protection switch 110 protects a battery pack 136 from potential faulty conditions in a load 138. Protection switch 110 has a common terminal 120 connected to a negative terminal of battery pack 136 and to a negative terminal of load 138. A first current conducting terminal 130 of protection switch 110 is connected to a positive terminal of battery pack 136 and a second current conducting terminal 140 of protection switch 110 is coupled to a positive terminal of load 138 via a power switch 134. Under faulty conditions, protection switch 110 becomes non-conductive between terminal 130 and terminal 140, resulting in battery pack 136 being isolated from load 138. Suitable structures for load 138 include passive devices such as, for example, resistors, capacitors, and inductors, as well as active devices such as, for example, transistors. Battery pack 136, which is equivalent to a voltage source 135 and an internal resistor 137 in a series combination, may include a single battery, a DC power source, or combinations thereof.

Protection switch 110 includes a p-channel insulated gate FET 112 serving as a switch between terminal 130 and terminal 140, and an n-channel insulated gate FET 114 for controlling of FET 112. FET 112 has a source electrode connected to terminal 130, and a drain electrode connected to terminal 140. FET 114 has a gate electrode coupled to the drain electrode of FET 112 via a resistor 118, a source electrode serving as a control terminal of protection switch 110 and connected to terminal 120, and a drain electrode connected to a gate electrode of FET 112. A resistor 116 couples the source electrode of FET 112 to the gate electrode of FET 112. A resistor 122 couples the source electrode of FET 112 to the drain electrode of FET 112. A control resistor 124 has a first electrode connected to the gate electrode of FET 114 and a second electrode connected to the source electrode of FET 114. A current flowing through resistor 116 and a current flowing through resistors 118 and 124 do not flow through load 138 and, therefore, are considered as leakage currents. To minimize the leakage currents, resistors 116, 118, and 124 are preferably selected to have large resistance values, e.g., in the range of mega-ohms. It is also preferred to select a large resistance value for resistor 122 because a leakage current flowing through resistor 122, resistor 118, and resistor 124 continues to drain battery power when protection switch 110 is off. To provide a temperature sensing capability so that protection switch 110 will switch off at high temperatures, resistor 118 is designed to have a positive temperature coefficient and resistor 124 is designed to have a negative temperature coefficient.

FIG. 4 illustrates protection switch 110 as including p-channel FET 112 and n-channel FET 114. FIG. 4 further illustrates protection switch 110 as, under faulty conditions, isolating battery pack 136 from load 138 by disconnecting their positive terminals. It should be understood that this is not intended as a limitation of the present invention. FETs 112 and 114 in protection switch 110 may be replaced by bipolar transistors, insulated gate bipolar transistors, metal semiconductor field effect transistors, or the like. If protection switch 110 is used to disconnect the positive terminal of battery pack 136 from the positive terminal of load 138 under faulty conditions, such as in the embodiment illustrated in FIG. 4, FET 112 is designed to be either a p-channel field effect transistor or a PNP bipolar transistor and FET 114 is designed to be either an n-channel field effect transistor or an NPN bipolar transistor. On the other hand, if protection switch 110 is used to disconnect the negative terminal of battery pack 136 from the negative terminal of load 138 under faulty conditions, FET 112 is designed to be either an n-channel field effect transistor or an NPN bipolar transistor and FET 114 is designed to be either a p-channel field effect transistor or a PNP bipolar transistor.

Under normal operating conditions, in a very short interval, e.g., in the range of micro-seconds, after turning on power switch 134, a charge path from terminal 130 through resistor 122 and resistor 118 to the gate electrode of FET 114 places FET 114 in a conductive state. A current flowing through the drain and source electrodes of FET 114 develops a voltage across resistor 116 and switches on FET 112. Protection switch 110 becomes conductive between terminal 130 and terminal 140. When FET 112 is conductive, a portion of the load current of load 138 flows through FET 112 and the remaining portion of the load current flows through resistor 122. Because the resistance between its source and drain electrodes is much smaller than that of resistor 122, the portion of the load current flowing through resistor 122 is insignificant.

In a hard-short condition, the potential at the gate electrode of FET 114 is pulled down to the same potential as the negative terminal of battery pack 136, thereby rendering FET 114 non-conductive. A charge path from terminal 130 through resistor 116 to the gate electrode of FET 112 raises the potential at the gate electrode of FET 112 to the same potential as the source electrode of FET 112. FET 112 becomes non-conductive and isolates battery pack 136 from load 138. When the short circuit condition is removed, a charge path through resistor 118 to the gate electrode of FET 114 raises the potential at the gate electrode of FET 114. FET 114 becomes conductive and switches on FET 112 by pulling down the potential at the gate electrode of FET 112, resulting in protection switch 110 resetting itself.

In a soft-short condition, the low impedance between the positive and negative terminals of load 138 causes a large current flowing in battery pack 136 and load 138. The large current develops a voltage across internal resistor 137 in battery pack 136 and decreases the output voltage of battery pack 136, resulting in a decrease in the voltage across resistors 118 and 124. Resistor 118 and resistor 124 form a voltage divider. A soft-short trigger current is defined as a current in protection switch 110 when the gate-source voltage of FET 114, which is equal to the voltage across resistor 124, is equal to the threshold voltage of FET 114. When the current in protection switch 110 reaches or exceeds the soft-short trigger current, FET 114 becomes non-conductive and switches FET 112 off, resulting in battery pack 136 being isolated from load 138. When load 138 having the soft-short condition is removed, protection switch 110 resets itself to the normal operating state with both FETs 112 and 114 being conductive.

By adjusting the resistance ratio of resistor 118 to resistor 124 and the threshold voltage of FET 114, the short circuit response time and soft-short trigger current of protection switch 110 can be adjusted. A high resistance ratio of resistor 118 to resistor 124 and a high threshold voltage for FET 114 result in protection switch 110 having a fast short circuit response time and a low soft-short trigger current. Resistor 118 and the gate capacitance of FET 114 provide a time delay in changing the gate-source voltage of FET 114, thereby avoiding inadvertent switching-off of protection switch 110 that may be caused by a large capacitance in load 138.

Resistors 118 and 124 sense the temperature of protection switch 110 and switch FET 112 off if the temperature exceeds a predetermined value. As the temperature rises, the resistance of resistor 118 increases and the resistance of resistor 124 decreases because of their positive and negative temperature coefficients, respectively. Because resistors 118 and 124 work as a voltage divider, the voltage across the gate and source electrodes of FET 114, which is equal to the voltage across resistor 124, decreases with an increasing temperature. When the gate-source voltage of FET 114 is lower than its threshold voltage, a trigger temperature of protection switch 110 is reached and FET 114 becomes non-conductive and switches FET 112 off. It should be noted that the resistance ratio of resistor 118 to resistor 124, the temperature coefficients of resistors 118 and 124, and the threshold voltage of FET 114 determine the trigger temperature of protection switch 110.

Figure 5:
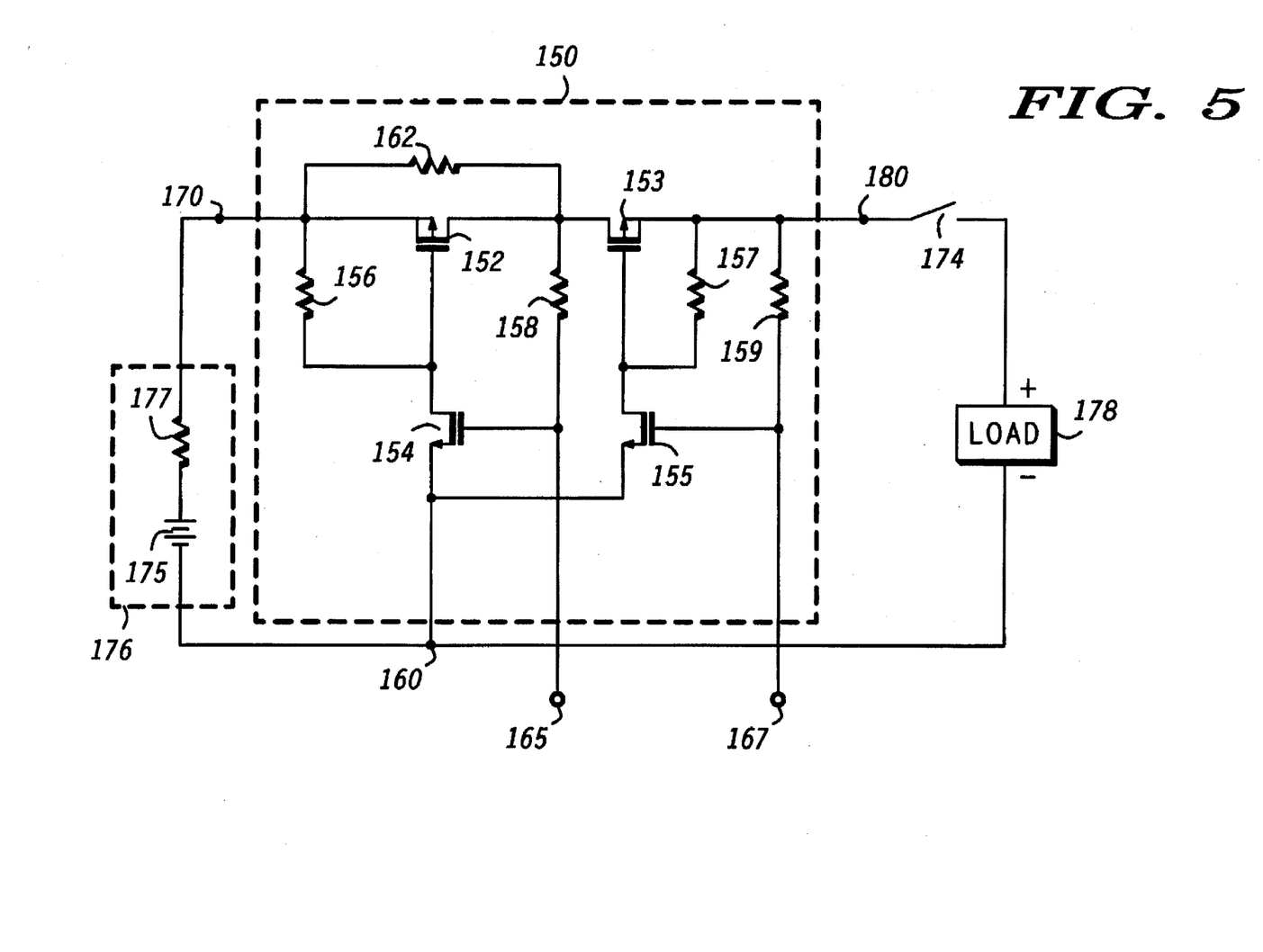
FIG. 5 illustrates a schematic diagram of a protection switch in accordance with a fifth embodiment of the present invention.

FIG. 5 illustrates a schematic diagram of a protection switch 150 in accordance with a fifth embodiment of the present invention. Protection switch 150 protects a battery pack 176 from potential faulty conditions in a load 178 during both charging and discharging cycles. Protection switch 150 has a common terminal 160 connected to a negative terminal of battery pack 176 and to a negative terminal of load 178. A first terminal 170 of protection switch 150 is connected to a positive terminal of battery pack 176 and a second terminal 180 of protection switch 150 is connected to a positive terminal of load 178 via a power switch 174. Under faulty conditions, protection switch 150 becomes non-conductive between terminal 170 and terminal 180, thereby isolating battery pack 176 from load 178. Suitable structures for load 178 include passive devices such as, for example, resistors, capacitors, and inductors, as well as active devices such as, for example, transistors. Battery pack 176, which is equivalent to a voltage source 175 and an internal resistor 177 in a series combination, may include a single battery, a DC power source, or combinations thereof.

Protection switch 150 includes a first p-channel insulated FET 152 serving as a switch between terminal 170 and terminal 180 during a discharging cycle, a first n-channel FET 154 for controlling FET 152, a second p-channel FET 153 serving as a switch between terminal 180 and terminal 170 during a charging cycle, and a second n-channel FET 155 for controlling FET 153. FET 152 has a source electrode connected to terminal 170, a drain electrode connected to a drain electrode of FET 153, and a gate electrode connected to a drain electrode of FET 154. FET 154 has a gate electrode coupled to the drain electrode of FET 152 via a resistor 158 and a source electrode connected to terminal 160. A resistor 156 couples the source electrode of FET 152 to the gate electrode of FET 152. A resistor 162 couples the source electrode of FET 152 to the drain electrode of FET 152. FET 153 has a source electrode connected to terminal 180 and a gate electrode connected to a drain electrode of FET 155. FET 155 has a gate electrode coupled to the drain electrode of FET 153 via a resistor 159 and a source electrode connected to the source electrode of FET 154. A resistor 157 couples the source electrode of FET 153 to the gate electrode of FET 153. The gate electrodes of FET 154 and FET 155 are coupled to a node 165 and a node 167, respectively, for receiving control signals. A current flowing through resistor 156 and a current flowing through resistor 157 do not flow through load 178 and, therefore, are considered as leakage currents. To minimize the leakage currents, resistors 156 and 157 are preferably selected to have large resistance values, e.g., in the range of mega-ohms. It is also preferred to select a large resistance value for resistor 162 because a current flowing through resistor 162 continues to drain the battery power when protection switch 150 is off. To provide a soft-short switching-off capability, protection switch 150 may include a control resistor (not shown) coupled between the gate electrode and FET 154 to the source electrode of FET 154. To further provide a temperature sensing capability so that protection switch 150 will switch off at high temperatures during a discharging cycle, resistor 158 is designed to have a positive temperature coefficient and the control resistor coupled between the gate and source electrodes of FET 154 is designed to have a negative temperature coefficient. To provide a temperature sensing capabilities so that protection switch 150 will switching-off at high temperatures during a charging cycle, resistor 159 may be designed to have a positive temperature coefficient and a resistor (not shown) having a negative temperature coefficient may be included in protection switch 150 and coupled between the gate electrode of FET 155 and the source electrode of FET 155.

FIG. 5 illustrates protection switch 150 as including FETs 152 and 153 as two p-channel insulated gate field transistors, and FETs 154 and 155 as two n-channel insulated gate field effect transistors. FIG. 5 further illustrates protection switch 150 as, under faulty conditions, isolating battery pack 176 from load 178 by disconnecting their positive terminals. It should be understood that this is not intended as a limitation of the present invention. FETs 152, 153, 154, and 155 in protection switch 150 may be replaced by bipolar transistors, insulated gate bipolar transistors, metal semiconductor field effect transistors, or the like. If protection switch 150 is used to disconnect the positive terminal of battery pack 176 from the positive terminal of load 178 under faulty conditions, such as in the embodiment illustrated in FIG. 5, FETs 152 and 153 are designed to be either p-channel field effect transistors or PNP bipolar transistors, and FETs 154 and 155 are designed to be either n-channel field effect transistors or NPN bipolar transistors. On the other hand, if protection switch 150 is used to disconnect the negative terminal of battery pack 176 from the negative terminal of load 178 under faulty conditions, FETs 152 and 153 are designed to be either n-channel field effect transistors or NPN bipolar transistors, and FETs 154 and 155 are designed to be either p-channel field effect transistors or PNP bipolar transistors.

Under normal operating conditions during a discharging cycle, in a very short interval, e.g., in the range of microseconds, after turning on power switch 174, a charge path from terminal 170 through resistors 162 and 158 to the gate electrode of FET 154 places FET 154 in a conductive state. A current flowing through the drain and source electrodes of FET 154 develops a voltage across resistor 156 and switches on FET 152. When FET 152 is conductive, the resistance between its source and drain electrodes is much smaller than that of resistor 162 and, therefore, the current through resistor 162 is insignificant. Similarly, a charge path from terminal 170, through resistor 162, the drain-source electrode of FET 153, and resistor 159, to the gate electrode of FET 155 places FET 155 in a conductive state, thereby switching on FET 153. FETs 152 and 153, both being conductive, complete the current path between battery pack 176 and load 178. It should be noted that, because of the orientation of the body diode of FET 153, a current can flow though FET 153 from its drain electrode to its source electrode even if FET 153 is switched off. Therefore, the state of FET 153 is inconsequential for protection switch 150 during the discharging cycle. Resistor 158 and the gate capacitance of FET 154 provide a delay time in changing the gate-source voltage of FET 154, thereby avoiding inadvertent switching-off of protection switch 150 that may be caused by a large capacitance in load 178. A system processor, not shown in FIG. 5, can modulate the load current by adjusting a control signal applied to node 165.

In a hard-short condition during a discharging cycle, the potential at the gate electrode of FET 154 decreases. FET 154 becomes non-conductive when the voltage across its gate and source electrodes is lower than its threshold voltage. A charge path from terminal 170 through resistor 156 to the gate electrode of FET 152 raises the potential at the gate electrode of FET 152 to the same potential as that at the source electrode of FET 152. FET 152 becomes non-conductive and isolates battery pack 176 from load 178. Similarly, FET 155 and FET 153 are also switched off. When the short circuit condition is removed, a charge path to the gate electrode of FET 154 and a charge path to the gate electrode of FET 155 switch on FETs 154 and 155, respectively. FETs 154 and 155, both being conductive, switch on FETs 152 and 153, respectively, thereby resetting protection switch 150 to its normal operating conditions.

During a charging cycle, load 178 is replaced by a battery charger serving as a power source and battery pack 176 becomes a load. The charging current flows into battery pack 176 through its positive terminal. Because of the orientation of the body diode of FET 152, a current can flow through FET 152 from its drain electrode to its source electrode even if FET 152 is switched off and, therefore, the state of FET 152 is inconsequential for protection switch 150 in the charging cycle. While charging battery pack 176, a system processor, not shown in FIG. 5, constantly monitors the voltage level of battery pack 176. If an abnormal condition is detected, the system processor sends a signal to node 167 to switch FET 155 off. A charge path form terminal 180 through resistor 157 to the gate electrode of FET 153 raises the potential at the gate electrode of FET 153 to that at the source electrode of FET 153, resulting in FET 153 becoming non-conductive and battery pack 176 being isolated from the battery charger to prevent further charging. Furthermore, the system processor can modulate the current flowing through the battery by adjusting the control signal applied to node 167.

Figure 6:
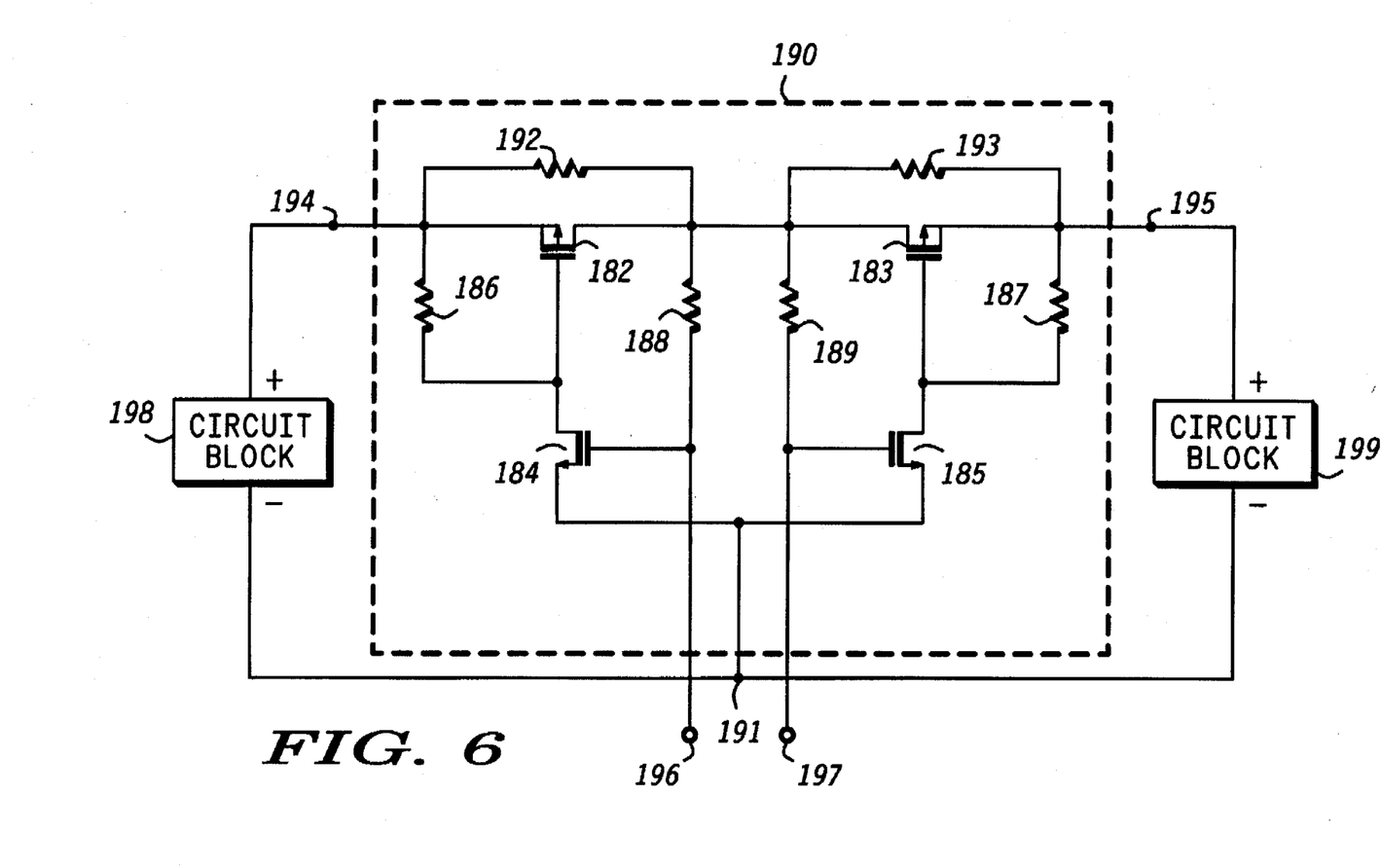
FIG. 6 illustrate a schematic diagram of a bi-directional protection switch in accordance with a sixth embodiment of the present invention.

FIG. 6 illustrates a schematic diagram of a bi-directional protection switch 190 in accordance with a sixth embodiment of the present invention. Protection switch 190 protects a circuit block 198 from potential faulty conditions in a circuit block 199 and protects circuit block 199 from potential faulty conditions in circuit block 198. Protection switch 190 has a common terminal 191 connected to negative terminals of circuit blocks 198 and 199. A first terminal 194 of protection switch 190 is connected to a positive terminal of circuit block 198 and a second terminal 195 of protection switch 190 is connected to a positive terminal of circuit block 199. Under faulty conditions, protection switch 190 becomes non-conductive between terminal 194 and terminal 195, thereby isolating circuit blocks 198 and 199 from each other. Suitable structures for circuit blocks 198 and 199 include passive devices such as, for example, resistors, capacitors, and inductors, as well as active devices such as, for example, transistors.

Protection switch 190 includes two switching elements, each switching element having a structure similar to protection switch 110 in FIG. 4. As shown in FIG. 6, two p-channel insulated gate FETs 182 and 183 serve as switches between terminal 194 and terminal 195, and two n-channel insulated gate FETs 184 and 185 control FETs 182 and 183, respectively. FET 182 has a source electrode connected to terminal 194 and a drain electrode connected to a drain electrode of FET 183. A source electrode of FET 183 is connected to terminal 195. FET 184 has a gate electrode coupled to the drain electrode of FET 182 via a resistor 188, a source electrode connected to terminal 191, and a drain electrode connected to a gate electrode of FET 182. FET 185 has a gate electrode coupled to the drain electrode of FET 183 via a resistor 189, a source electrode connected to terminal 191, and a drain electrode connected to a gate electrode of FET 183. A resistor 186 couples the source electrode of FET 182 to the gate electrode of FET 182. A resistor 187 couples the source electrode of FET 183 to the gate electrode of FET 183. A resistor 192 couples the source electrode of FET 182 to the drain electrode of FET 182. A resistor 193 couples the source electrode of FET 183 to the drain electrode of FET 183. The gate electrodes of FETs 184 and 185 are connected to nodes 196 and 197, respectively, for receiving control signals.

FIG. 6 illustrates protection switch 190 as including FETs 182 and 183 as p-channel insulated gate field transistors and FETs 184 and 185 as n-channel insulated gate field effect transistors. FIG. 6 further illustrates protection switch 190 as, under faulty conditions, isolating circuit blocks 198 and 199 from each other by disconnecting their positive terminals. It should be understood that this is not intended as a limitation of the present invention. FETs 182, 183, 184, and 185 in protection switch 190 may be replaced by bipolar transistors, insulated gate bipolar transistors, metal semiconductor field effect transistors, or the like. If protection switch 190 is used to disconnect the positive terminals of circuit block 198 from the positive terminal of circuit block 199 under faulty conditions, such as in the embodiment illustrated in FIG. 6, FETs 182 and 183 are designed to be either p-channel field effect transistors or PNP bipolar transistors and FETs 184 and 185 are designed to be either n-channel field effect transistors or NPN bipolar transistors. On the other hand, if protection switch 190 is used to disconnect the negative terminals of circuit block 198 from the negative terminal of circuit block 199 under faulty conditions, FETs 182 and 183 are designed to be either n-channel field effect transistors or NPN bipolar transistors and FETs 184 and 185 are designed to be either p-channel field effect transistors or PNP bipolar transistors. To provide a soft-short switching-off capability, protection switch 190 can include a first control resistor (not shown) for coupling the gate electrode of FET 184 to the source electrode of FET 184 and a second control resistor (not shown) for coupling the gate electrode of FET 185 to the source electrode of FET 185. For temperature sensing capabilities, the two control resistors are designed to have negative temperature coefficients, and resistors 188 and 189 are designed to have positive temperature coefficients.

Under normal operating conditions, a charge path from terminal 194 through resistor 188 to the gate electrode of FET 184 places FET 184 in a conductive state. A current flowing through the drain and source electrodes of FET 184 develops a voltage across resistor 186 and switches on FET 182. While FET 182 is conductive, the current flowing through resistor 192 is insignificant due to the large resistance value of resistor 192. Likewise, a charge path from terminal 195 through resistor 189 to the gate electrode of FET 185 places FET 185 in a conductive state. A current flowing through the drain and source electrodes of FET 185 develops a voltage across resistor 187 and switches on FET 183. While FET 183 is conductive, the current flowing through resistor 193 is insignificant due to the large resistance value of resistor 193. FETs 182 and 183, both being conductive, complete the current path between circuit blocks 198 and 199.

Under short circuit conditions, protection switch 190 operates in the same way as protection switch 110 in FIG. 4 and protection switch 150 in FIG. 5 during the discharging cycle. Because protection switch 190 is symmetric, it terminates current flowing in both directions under short circuit conditions. FET 182 is used to stop the current that flows from terminal 194 to terminal 195, and FET 183 is used to stop the current that flows from terminal 195 to terminal 194.

Nodes 196 and 197 offer user controllability of protection switch 190. A control signal applied to node 196 is used to terminate the current flowing from terminal 194 to terminal 195 and a control signal applied to node 197 is used to terminate the current flowing from terminal 195 to terminal 194.

By now it should be appreciated that a protection element and a method for protecting a circuit from stresses have been provided. The protection element in accordance with the present invention disconnects the power source from the load if a short circuit condition is detected. The protection element resets itself when the load with faulty conditions is removed or disconnected by opening the power switch. Furthermore, the protection element of the present invention has over-temperature switching-off and current limiting capabilities, and user controllability. The protection element is suitable for manufacture using standard semiconductor processing techniques. Accordingly it offers a simple, reliable, and inexpensive method for protecting a power source from potential faulty conditions.

I claim:

1. A protection element for protecting a battery pack having a first battery terminal and a second battery terminal from a faulty condition in a load having a first load terminal and a second load terminal, comprising a first switch, wherein the first switch includes:

a first transistor having a control electrode, a first current conducting electrode for coupling to the first battery terminal, and a second current conducting electrode for coupling to the first load terminal;

a second transistor having a control electrode, a first current conducting electrode coupled to the first current conducting electrode of the first transistor, and a second current conducting electrode coupled to the control electrode of the first transistor;

a first resistor having a first electrode for coupling to the second battery terminal and to the second load terminal, and a second electrode coupled to the control electrode of the first transistor;

a second resistor having a first electrode coupled to the second current conducting electrode of the first transistor and a second electrode coupled to the first current conducting electrode of the second transistor; and a third resistor having a first electrode coupled to the first electrode of the second resistor and a second electrode coupled to the control electrode of the second transistor.

2. The protection element of claim 1, wherein:

the first transistor is an insulated gate field effect transistor having a gate electrode serving as the control electrode, a source electrode serving as the first current conducting electrode, and a drain electrode serving as the second current conducting electrode; and the second transistor is an insulated gate field effect transistor having a gate electrode serving as the control electrode, a source electrode serving as the first current conducting electrode, and a drain electrode serving as the second current conducting electrode.

3. The protection element of claim 2, wherein the first and second transistors are n-channel insulated gate field effect transistors, and wherein the first battery terminal is a negative terminal of the battery pack and the second battery terminal is a positive terminal of the battery pack.

4. The protection element of claim 1, wherein the first switch further includes a control resistor having a first electrode and a second electrode, wherein the first electrode is coupled to the first current conducting electrode of the first transistor and the second electrode is coupled to the control electrode of the first transistor.

5. The protection element of claim 4, wherein the first resistor has a positive temperature coefficient and the control resistor has a negative temperature coefficient.

6. The protection element of claim 1, wherein the first switch further includes a temperature sensor having a first electrode and a second electrode, wherein the first electrode is coupled to the first current conducting electrode of the first transistor and the second electrode is coupled to the control electrode of the first transistor.

7. The protection element of claim 6, wherein the temperature sensor includes:

a third transistor having a control electrode, a first current conducting electrode, and a second current conducting electrode, wherein the first current conducting electrode serves as the first electrode of the temperature sensor and the second current conducting electrode serves as the second electrode of the temperature sensor;

a first control resistor with a negative temperature coefficient having a first electrode and a second electrode, wherein the first electrode is coupled to the control terminal of the first switch and the second electrode is coupled to the control electrode of the third transistor; and a second control resistor with a positive temperature coefficient having a first electrode and a second electrode, wherein the first electrode is coupled to the control electrode of the third transistor and the second electrode is coupled to the first current conducting electrode of the third transistor.

8. The protection element of claim 1, wherein the first switch further includes:

a fourth transistor having a control electrode, a first current conducting electrode, and a second current conducting electrode, wherein the first current conducting electrode is coupled to the first current conducting electrode of the first transistor and the second current conducting electrode is coupled to the control electrode of the first transistor;

a fifth transistor having a control electrode, a first current conducting electrode, and a second current conducting electrode, wherein the control electrode is coupled to the control electrode of the first transistor, the first current conducting electrode is coupled to the control electrode of the fourth transistor, and the second current conducting electrode is coupled to the second current conducting electrode of the first transistor; and a sense resistor having a first electrode and a second electrode, wherein the first electrode is coupled to the first current conducting electrode of the fifth transistor and the second electrode is coupled to the first current conducting electrode of the fourth transistor.

9. The protection element of claim 8, wherein the first current conducting electrode of the fifth transistor is coupled to the control electrode of the fourth transistor via an amplifier, wherein the amplifier has an input terminal coupled to the first current conducting electrode of the fifth transistor and an output terminal coupled to the control electrode of the fourth transistor.

10. The protection element of claim 1, wherein the second current conducting electrode of the first transistor is for coupling to the first load terminal via a second switch.

11. The protection element of claim 10, wherein the second switch includes:

a third transistor having a control electrode, a first current conducting electrode for coupling to the first load terminal and a second current conducting electrode coupled to the second current conducting electrode of the first transistor; and a fourth resistor having a first electrode coupled to the first electrode of the first resistor and a second electrode coupled to the control electrode of the third transistor.

12. The protection element of claim 11, wherein the control electrode of the third transistor is coupled for receiving a control signal.

13. The protection element of claim 10, wherein the second switch is of a same structure as the first switch.

14. A protection switch having a first terminal, a second terminal, and a common terminal, comprising a first switching element having a first current conducting terminal coupled to the first terminal, a second current conducting terminal coupled to the second terminal, and a control terminal coupled to the common terminal, wherein the first switching element includes:

a first transistor of a first type having a control electrode, a first current conducting electrode, and a second current conducting electrode, wherein the first current conducting electrode serves as the first current conducting terminal of the first switching element and the second current conducting electrode serves as the second current conducting terminal of the first switching element;

a second transistor of a second type having a control electrode, a first current conducting electrode, and a second current conducting electrode, wherein the first current conducting electrode is coupled to the control terminal of the first switching element and the second current conducting electrode is coupled to the control electrode of the first transistor;

a first resistor having a first electrode and a second electrode, wherein the first electrode is coupled to the first current conducting electrode of the first transistor and the second electrode is coupled to the control electrode of the first transistor;

a second resistor having a first electrode and a second electrode, wherein the first electrode is coupled to the second current conducting electrode of the first transistor and the second electrode is coupled to the control electrode of the second transistor; and a third resistor having a first electrode and a second electrode, wherein the first electrode is coupled to the first current conducting electrode of the first transistor and the second electrode is coupled to the second current conducting electrode of the first transistor.

15. The protection switch of claim 14, wherein;

the first transistor is a p-channel insulated gate field effect transistor having a gate electrode serving as the control electrode, a source electrode serving as the first electrode current conducting electrode, and a drain electrode serving as the second current conducting electrode; and the second transistor is an n-channel insulated gate field effect transistor having a gate electrode serving as the control electrode, a source electrode serving as the first current conducting electrode, and a drain electrode serving as the second current conducting electrode.

16. The protection switch of claim 14, wherein the control electrode of the second transistor is coupled for receiving a control signal.

17. The protection switch of claim 14, wherein the first switching element further includes a control resistor having a first electrode and a second electrode, wherein the first electrode is coupled to the control electrode of the second transistor and the second electrode is coupled to the first current conducting electrode of the second transistor.

18. The protection switch of claim 17, wherein the second resistor has a positive temperature coefficient and the control resistor has a negative temperature coefficient.

19. The protection switch of claim 14, wherein the second current conducting terminal of the first switching element is coupled to the second terminal of the protection switch via a second switching element, wherein the second switching element has a control terminal coupled to the common terminal of the protection switch, a first current conducting terminal coupled to the second terminal of the protection switch, and a second current conducting terminal coupled to the second current conducting terminal of the first switching element.

20. The protection switch of claim 19, wherein the second switching element includes:

a third transistor of the first type having a control electrode, a first current conducting electrode, and a second current conducting electrode, wherein the first current conducting electrode serves as the first current conducting terminal of the second switching element and the second current conducting electrode serves as the second current conducting terminal of the second switching element;

a fourth transistor of the second type having a control electrode, a first current conducting electrode, and a second current conducting electrode, wherein the first current conducting electrode serves as the control terminal of the second switching element and the second current conducting electrode is coupled to the control electrode of the third transistor;

a fourth resistor having a first electrode and a second electrode, wherein the first electrode is coupled to the first current conducting electrode of the third transistor and the second electrode is coupled to the control electrode of the third transistor; and a fifth resistor having a first electrode and a second electrode, wherein the first electrode is coupled to the first current conducting electrode of the third transistor and the second electrode is coupled to the control electrode of the fourth transistor.

21. The protection switch of claim 20, wherein the control electrode of the fourth transistor is coupled for receiving a control signal.

22. The protection switch of claim 19, wherein the second switching element is of a same structure as the first switching element.

23. A method for protecting a circuit, comprising the steps of:

providing the circuit comprising a first circuit block and a second circuit block, wherein the first circuit block has a first terminal and a second terminal, and the second circuit block has a first terminal and a second terminal;

coupling the first terminal of the first circuit block to the first terminal of the second circuit block;

providing a first switch having a first current conducting electrode coupled to the second terminal of the first circuit block and a second current conducting electrode coupled to the second terminal of the second circuit block;

placing the first switch in a conductive state;

passing a current from the first terminal of the first circuit block to the second terminal of the first circuit block via the second circuit block and the first switch;

directly sensing a voltage across the first terminal and the second terminal of the second circuit block; and placing the first switch in a non-conductive state to terminate the current in response to the voltage being less than a predetermined voltage value.

24. The method for protecting a circuit as claimed in claim 23, further comprising placing the first switch in a non-conductive state to terminate the current in response to a temperature of the circuit exceeding a predetermined temperature value.

25. The method for protecting a circuit as claimed in claim 23, wherein the step of placing the first switch in a conductive state includes the steps of:

coupling the first current conducting electrode of the first switch to a control electrode of the first switch via a second switch;

coupling the first terminal of the first circuit block to the control electrode of the first switch via a resistor; and placing the second switch in a non-conductive state.

26. The method for protecting a circuit as claimed in claim 25, wherein the step of placing the first switch in a non-conductive state includes placing the second switch in a conductive state.

27. The method for protecting a circuit as claimed in claim 23, wherein the step of placing the first switch in a conductive state includes the steps of:

coupling the first terminal of the first circuit block to a control electrode of the first switch via a second switch;

coupling the first current conducting electrode of the first switch to the control electrode of the first switch via a resistor; and placing the second switch in a conductive state.

28. The method for protecting a circuit as claimed in claim 27, wherein the step of placing the first switch in a non-conductive state includes placing the second switch in a non-conductive state in response to the voltage across the first terminal and the second terminal of the second circuit block being less than the predetermined voltage value.

29. The method for protecting a circuit as claimed in claim 23, wherein the step of passing a current from the first terminal of the first circuit block to the second terminal of the first circuit block via the second circuit block and the first switch includes the steps of:

generating a sense voltage from a portion of the current; and reducing the current in response to the sense voltage exceeding a predetermined voltage, resulting in the current not exceeding an upper limit.

30. The method for protecting a circuit as claimed in claim 29, wherein the step of reducing the current includes increasing a resistance between the first and second current conducting electrodes of the first switch by adjusting a voltage across a control electrode of the first switch and the first current conducting electrode of the first switch.

* * * * *